United States Patent
Luby

(10) Patent No.: US 9,455,750 B2
(45) Date of Patent: Sep. 27, 2016

(54) SOURCE BLOCK SIZE SELECTION

(71) Applicant: QUALCOMM Incorporated, San Diego, CA (US)

(72) Inventor: Michael George Luby, Berkeley, CA (US)

(73) Assignee: QUALCOMM Incorporated, San Diego, CA (US)

( * ) Notice: Subject to any disclaimer, the term of this patent is extended or adjusted under 35 U.S.C. 154(b) by 109 days.

(21) Appl. No.: 14/492,752

(22) Filed: Sep. 22, 2014

(65) Prior Publication Data

US 2016/0028416 A1  Jan. 28, 2016

Related U.S. Application Data

(60) Provisional application No. 62/051,709, filed on Sep. 17, 2014, provisional application No. 62/029,784, filed on Jul. 28, 2014.

(51) Int. Cl.
*H03M 13/00* (2006.01)
*H03M 13/37* (2006.01)

(52) U.S. Cl.
CPC ................................ *H03M 13/3761* (2013.01)

(58) Field of Classification Search
None
See application file for complete search history.

(56) References Cited

U.S. PATENT DOCUMENTS

| | | | |
|---|---|---|---|
| 8,472,877 B2 | 6/2013 | Hou et al. | |
| 8,787,153 B2 * | 7/2014 | Begen | H04L 1/0009 370/225 |
| 9,225,357 B2 * | 12/2015 | Myung | H03M 13/05 |
| 2009/0031199 A1 * | 1/2009 | Luby | H03M 13/29 714/800 |
| 2010/0017686 A1 | 1/2010 | Luby et al. | |
| 2012/0151302 A1 * | 6/2012 | Luby | H04N 21/4331 714/776 |
| 2012/0163340 A1 * | 6/2012 | Chin | H04W 36/0088 370/331 |
| 2013/0097470 A1 * | 4/2013 | Hwang | H04L 1/0041 714/758 |
| 2013/0294447 A1 * | 11/2013 | Myung | H04L 69/22 370/389 |
| 2015/0146615 A1 * | 5/2015 | Yu | H04L 5/0032 370/328 |

FOREIGN PATENT DOCUMENTS

| | | |
|---|---|---|
| EP | 2421265 A1 | 2/2012 |
| WO | WO-9930462 A2 | 6/1999 |

OTHER PUBLICATIONS

Roca V., et al., "Low Density Parity Check (LDPC) Staircase and Triangle Forward Error Correction (FEC) Schemes", draft-ietf-rmt-bb-fec-ldpc-05 txt, Mar. 29, 2007, pp. 1-34.

* cited by examiner

*Primary Examiner* — Daniel McMahon
(74) *Attorney, Agent, or Firm* — Norton Rose Fulbright US LLP

(57) ABSTRACT

Methods, apparatuses, and computer-readable media for determining a source block size are presented. A sender transmits received media as source blocks. The sender receives a value N, a target number of packets from which a receiver can recover a source block with high fidelity; a value P', a target packet payload size; a value O, a symbol reception overhead value; and a value R, a target upper bound on data reception overhead. The sender determines a value K, a number of symbols to be used per source block, based on the values N, P', O and R. The source symbols of the source blocks are encoded into encoded symbols. In some cases, the encoded symbols include the source symbol, and in other cases the encoded symbols do not include the source symbols. The encoded symbols are packetized into at least N packets for transmission to the receiver.

18 Claims, 9 Drawing Sheets

SOURCE BLOCK SIZE SELECTION

CROSS-REFERENCE TO RELATED APPLICATIONS

The present application claims priority to U.S. Provisional Patent Application No. 62/051,709, entitled "SOURCE BLOCK SIZE SELECTION," filed Sep. 17, 2014 and U.S. Provisional Patent Application No. 62/029,784, entitled "SOURCE BLOCK SIZE SELECTION," filed Jul. 28, 2014, the disclosures of which are hereby incorporated herein by reference.

BACKGROUND

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected, a simple parity code might be best.

Data transmission is straightforward when a transmitter and a receiver have all of the computing power and electrical power needed for communications and the channel between the transmitter and receiver is clean enough to allow for relatively error-free communications. The problem of data transmission becomes more difficult when the channel is in an adverse environment or the transmitter and/or receiver has limited capability.

One solution is the use of forward error correcting (FEC) techniques, wherein data is coded at the transmitter such that a receiver can recover from transmission erasures and errors. Where feasible, a reverse channel from the receiver to the transmitter allows the receiver to communicate about errors to the transmitter, which can then adjust its transmission process accordingly. Often, however, a reverse channel is not available or feasible. For example, where the transmitter is transmitting to a large number of receivers, the transmitter might not be able to handle reverse channels from all those receivers. As a result, communication protocols often need to be designed without a reverse channel and, as such, the transmitter may have to deal with widely varying channel conditions without a full view of those channel conditions.

The problem of data transmission between transmitters and receivers is made more difficult when the receivers need to be low-power, small devices that might be portable or mobile and need to receive data at high bandwidths. For example, a wireless network might be set up to deliver files or streams from a stationary transmitter to a large or indeterminate number of portable or mobile receivers either as a broadcast or as multicast where the receivers are constrained in their computing power, memory size, available electrical power, antenna size, device size, and other design constraints.

In such a system, considerations to be addressed include having little or no reverse channel, limited memory, limited computing cycles, mobility, and timing. Preferably, the design should minimize the amount of transmission time needed to deliver data to potentially a large population of receivers, where individual receivers might be turned on and off at unpredictable times, move in and out of range, incur losses due to link errors, cell changes, congestion in cells forcing lower priority file or stream packets to be temporarily dropped, etc.

In the case of a packet protocol used for data transport, a file, stream, or other data to be transmitted over a packet network is partitioned into blocks larger than the payload of a packet. The blocks can be divided into equal size input symbols to be encoded. The "size" of an input symbol can be measured in bits, whether or not the input symbol is actually broken into a bit stream, where an input symbol has a size of M bits when the input symbol is selected from an alphabet of $2^M$ symbols. In such a packet-based communication system, a packet oriented coding scheme might be suitable. A file transmission is called reliable if it allows the intended recipient to recover an exact copy of the original file even in the face of erasures in the network. A stream transmission is called reliable if it allows the intended recipient to recover an exact copy of each part of the stream in a timely manner even in the face of erasures in the network. Both file transmission and stream transmission can also be somewhat reliable, in the sense that some parts of the file or stream are not recoverable or for streaming, if some parts of the stream are not recoverable in a timely fashion. Packet loss often occurs because sporadic congestion causes the buffering mechanism in a router to reach its capacity, forcing it to drop incoming packets. Protection against erasures during transport has been the subject of much study.

It is known to use chain reaction codes to allow for generation of an arbitrary number of encoded symbols (also called output symbols) from the input symbols of a file or stream. This has many uses, including the generation of encoded symbols in an information additive way, as opposed to an information duplicative way, wherein the latter is where a receiver receives additional data that duplicates data the receiver already knows. Novel techniques for generating, using and operating chain reaction codes are shown, for example, in U.S. Pat. No. 6,307,487 entitled "Information Additive Code Generator and Decoder for Communication Systems" issued to Luby ("Luby II"), U.S. Pat. No. 6,320,520 entitled "Information Additive Group Code Generator and Decoder for Communication Systems" issued to Luby et al. (hereinafter "Luby III"), and U.S. Pat. No. 7,068,729 entitled "Multi-Stage Code Generator and Decoder for Communication Systems" issued to Shokrollahi et al. (hereinafter "Shokrollahi"). The entire disclosures of these patents are herein incorporated by reference for all purposes.

One property of the encoded symbols (also called output symbols) produced by a chain reaction encoder is that a receiver is able to recover the original file or block of the original stream as soon as enough encoded symbols have been received. Specifically, to recover the original K input symbols with a high probability, the receiver needs approximately K+O encoded symbols. The ratio O/K is called the "relative reception overhead." The relative reception overhead depends on the number K of input symbols, and on the reliability of the decoder. For example, in one specific embodiment, and where K is equal to 60,000, a relative reception overhead of 5% ensures that the decoder successfully decodes the input file or block of the stream with a probability of at least $1-10^{-8}$; and where K is equal to 10,000, a relative reception overhead of 15% ensures the same success probability of the decoder. In one embodiment, the relative reception overhead of chain reaction codes can be computed as (13*sqrt(K)+200)/K, where sqrt(K) is the square root of the number of input symbols K. In this embodiment, the relative reception overhead of chain reaction codes tends to be larger for small values of K.

As another example, the RaptorQ code described in IETF RFC 6330 has the property that if the reception overhead is 0, 1 or 2 symbols, then the decode failure probability of the code is 0.01, 0.0001, and 0.000001, respectively.

Luby II, Luby III, and Shokrollahi provide teachings of systems and methods that can be employed in certain embodiments described in this disclosure. It is to be understood, however, that the Luby II, Luby III, and Shokrollahi systems and methods are not required of the apparatus, systems, and methods described in this disclosure, and many other variations, modifications, or alternatives can also be used.

It is also known to use multi-stage chain reaction ("MSCR") codes, such as those described in Shokrollahi and developed by Digital Fountain, Inc. under the trade name "Raptor" codes. Multi-stage chain reaction codes are used, for example, in an encoder that receives input symbols from a source file or source stream, generates intermediate symbols therefrom and encodes the intermediate symbols using chain reaction codes. More particularly, a plurality of redundant symbols is generated from an ordered set of input symbols to be transmitted. A plurality of encoded symbols are generated from a combined set of symbols including the input symbols and the redundant symbols, wherein the number of possible encoded symbols is much larger than the number of symbols in the combined set of symbols, wherein at least one encoded symbol is generated from more than one symbol in the combined set of symbols and from less than all of the symbols in the combined set of symbols, and such that the ordered set of input symbols can be regenerated to a desired degree of accuracy from any predetermined number of the encoded symbols.

For some applications, other variations of codes might be more suitable or otherwise preferred. For example, Reed-Solomon codes might be suitable for some applications, as they provide optimal recovery of a source block from received encoded symbols without any data reception overhead, i.e., reception of any k encoded symbols for a source block with k source symbols allows recovery when a Reed-Solomon code is used, and thus the symbol overhead is zero. FEC codes, such as Reed-Solomon codes, that have zero symbol reception overhead are called "Maximum Distance Separable" (MDS) codes. However, MDS codes such as Reed-Solomon codes can become computationally intensive when used with larger values of k, e.g., values of k that is a few tens or larger, and thus may not be suitable for usage in applications that require larger values of k. On the other hand, MSCR codes such as RaptorQ codes can be used with larger values of k, e.g., values of k that range up to many tens of thousands. However, these are not MDS codes, and applications using non-MDS FEC codes can experience larger than desired data reception overhead if the non-MDS FEC codes are used in a straightforward way.

SUMMARY

An exemplary method for data communication over a communications channel of the present disclosure comprises receiving one or more data transmission parameters with respect the data communication over the communications channel, and determining, using at least one data transmission parameter of the one or more data transmission parameters, a source block size for the data communication over the communications channel. In accordance with embodiments of the disclosure, the source block size is a size determined to fit in an integer number of packets used for the data communication with at least a predetermined amount of packet payload capacity remaining available in the integer number of packets.

An exemplary apparatus for data communication over a communications channel of the present disclosure comprises one or more data processors, and one or more non-transitory computer-readable storage media containing program code configured to cause the one or more processors to perform operations including receiving one or more data transmission parameters with respect the data communication over the communications channel, and determining, using at least one data transmission parameter of the one or more data transmission parameters, a source block size for the data communication over the communications channel. In accordance with embodiments of the disclosure, the source block size is a size determined to fit in an integer number of packets used for the data communication with at least a predetermined amount of packet payload capacity remaining available in the integer number of packets.

In the figures, components with similar relevant characteristics and/or features may have the same reference label.

DETAILED DESCRIPTION

Techniques described herein provide mechanisms for selecting a size for source blocks. A media stream, for example, can be partitioned into source blocks for encoding and transmission. The source block data can be divided into symbols (source symbols) of a selected size which may be encoded, such as using an erasure code (e.g., forward error correction (FEC) encoding), to generate some number of repair symbols, and the source and repair symbols packetized for transmission over a network. Using such erasure codes, the source block may be recovered if a certain number (e.g., less than all) of the transmitted packets are received. Reception overhead is an amount of redundant information that must be received in order to have a desired probability of recovering the original source block using some configurations of the aforementioned erasure encoded symbols. Embodiments of the techniques herein provide for selecting a size for the source blocks so as to provide for a low (e.g., minimized or optimized) reception overhead.

For some applications, such as low latency streaming, it may be desirable to minimize the size of source blocks into which a media stream is divided. When a live event is being recorded for broadcast, sending small source blocks can reduce the time between when media is recorded and when the media is received at a device for playback. Dividing a media stream into relatively short source blocks allows the media stream to be reconstructed after relatively few packets are received.

In some embodiments, the media is encoded using FEC. For example, FEC having a reception overhead of greater than zero may be used. For FEC in which redundant information is sent, smaller source blocks may require relatively more redundant information for recovery of each block. Accordingly, to select a source block size that is large as possible or that is otherwise of an acceptable size (e.g., satisfactory for particular applications, such as low latency streaming) while providing low or acceptable reception overhead, it may be desirable to determine a source block size based on a target reception overhead value according to embodiments herein.

Figure 1:
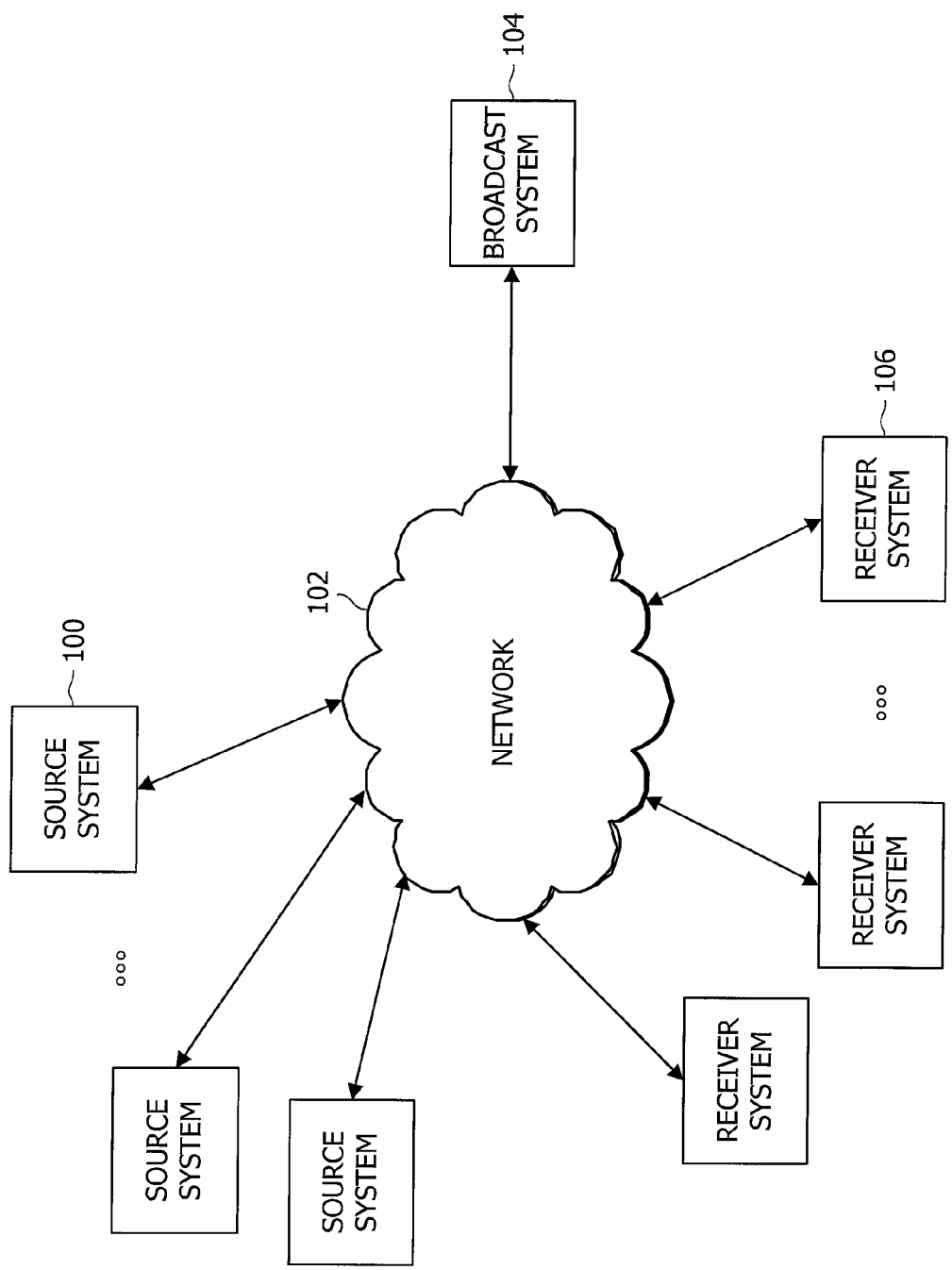
FIG. 1 is an illustrative embodiment of a network on which encoded data may be transmitted.

FIG. 1 is an illustrative embodiment of a network on which encoded data may be transmitted. In one embodiment, one or more source systems 100 send media via network 102 to broadcast system 104. Source systems may be any capable of encoding media and transmitting the encoded media, such as a recording device, a mobile device, a computer, etc. Broadcast system 104 may send the encoded data to one or more receiver systems 106. Broadcast system 104 may be one or more computers, such as one or more server computers. The media may be transmitted from broadcast system 104 to receiver systems 106 as FEC encoded data. In some embodiments, broadcast system 104 transmits data stored on broadcast system 104 or received from a computer or other device communicatively connected to broadcast system 104. Broadcast system 104 may decode and/or encode media for transmission to receiver systems 106.

Receiver systems 106 may be any system capable of receiving media, such as a mobile device, a computer, etc. Receiver systems 106 may be capable of playing back media such as video, audio, presentation, images, or other media. In some embodiments, source systems 100 stream media as encoded data to receiver systems 106 via network 102.

Figure 2:
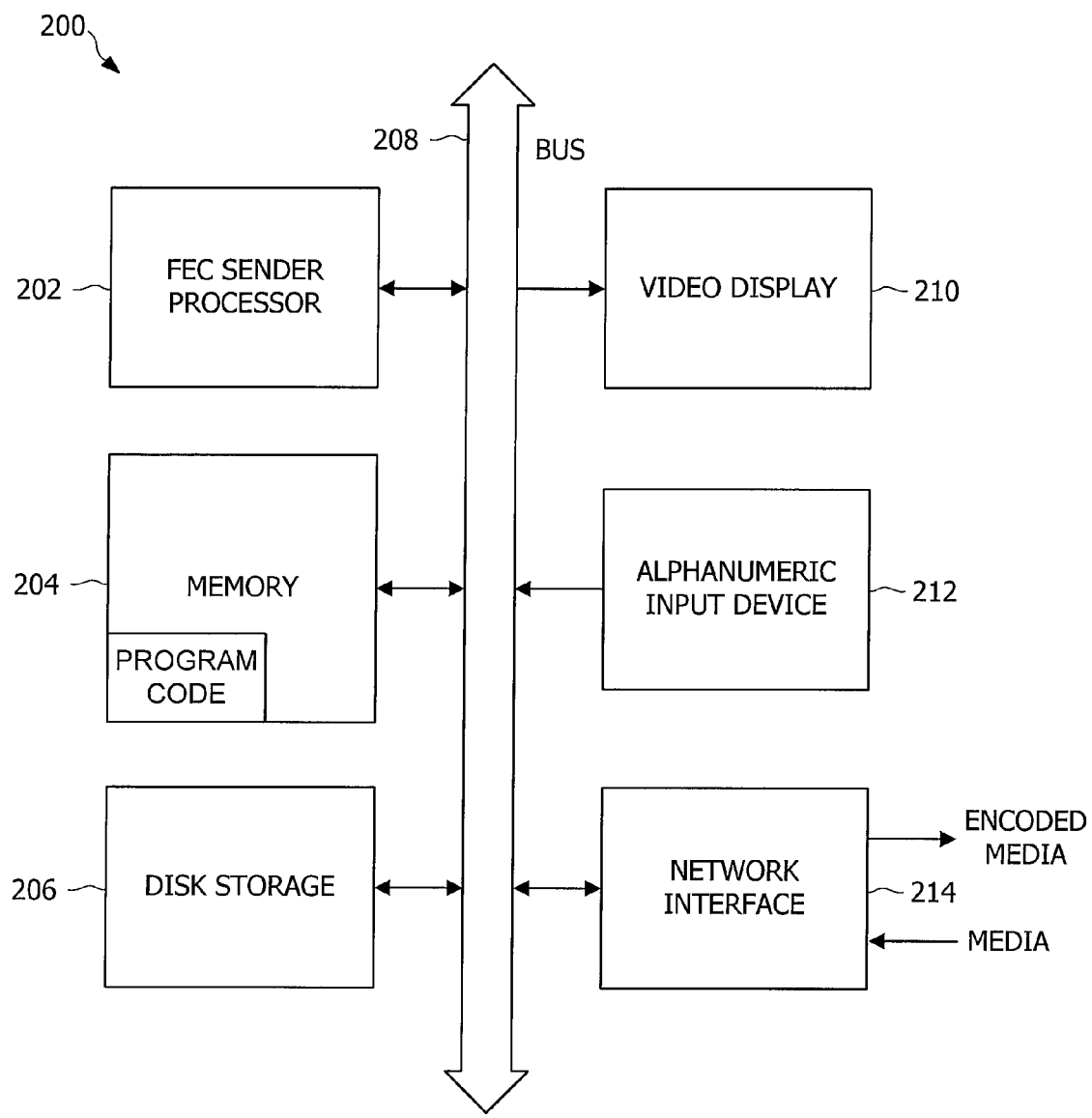
FIG. 2 is an illustrative embodiment of an FEC sender.

FIG. 2 is an illustrative embodiment of an FEC sender 200. FEC sender 200 is a system that encodes data and transmits the encoded data to an FEC receiver. FEC sender 200 may be a source system 100 and/or a broadcast system 104. FEC sender 200 may be implemented as a combination of hardware and software components, according to various embodiments. FEC sender 200 may comprise a set of instructions that can be executed to cause the system to perform any one or more of the methodologies discussed herein. The system may be realized as a specific machine in the form of a computer. The system may be a server computer, a personal computer (PC), mobile device, recording device, or any other system capable of executing a set of instructions (sequential or otherwise) that specify actions to be taken by that system. Further, while only a single system is illustrated, the term "system" shall also be taken to include any collection of systems that individually or jointly execute a set (or multiple sets) of instructions to perform any one or more of the methodologies discussed herein.

FEC sender 200 may include sender processor 202 (e.g., a central processing unit (CPU)), a memory 204 which may store program code during execution, and disk storage unit 206, all of which may communicate with each other via a bus 208. The system may further include a video display unit 210 (e.g., a liquid crystal display (LCD) or cathode ray tube (CRT)). The system also may include an alphanumeric input device 212 (e.g., a keyboard), and a network interface 214 for receiving media and transmitting encoded media.

The disk storage unit 206 may include a machine-readable medium on which may be stored one or more sets of instructions (e.g., software) embodying any one or more of the methodologies or functions described herein. The instructions may also reside, completely or at least partially, within the memory 204 and/or within the sender processor 202 during execution thereof by the system, with the memory 204 and the sender processor 202 also constituting machine-readable media.

Figure 3:
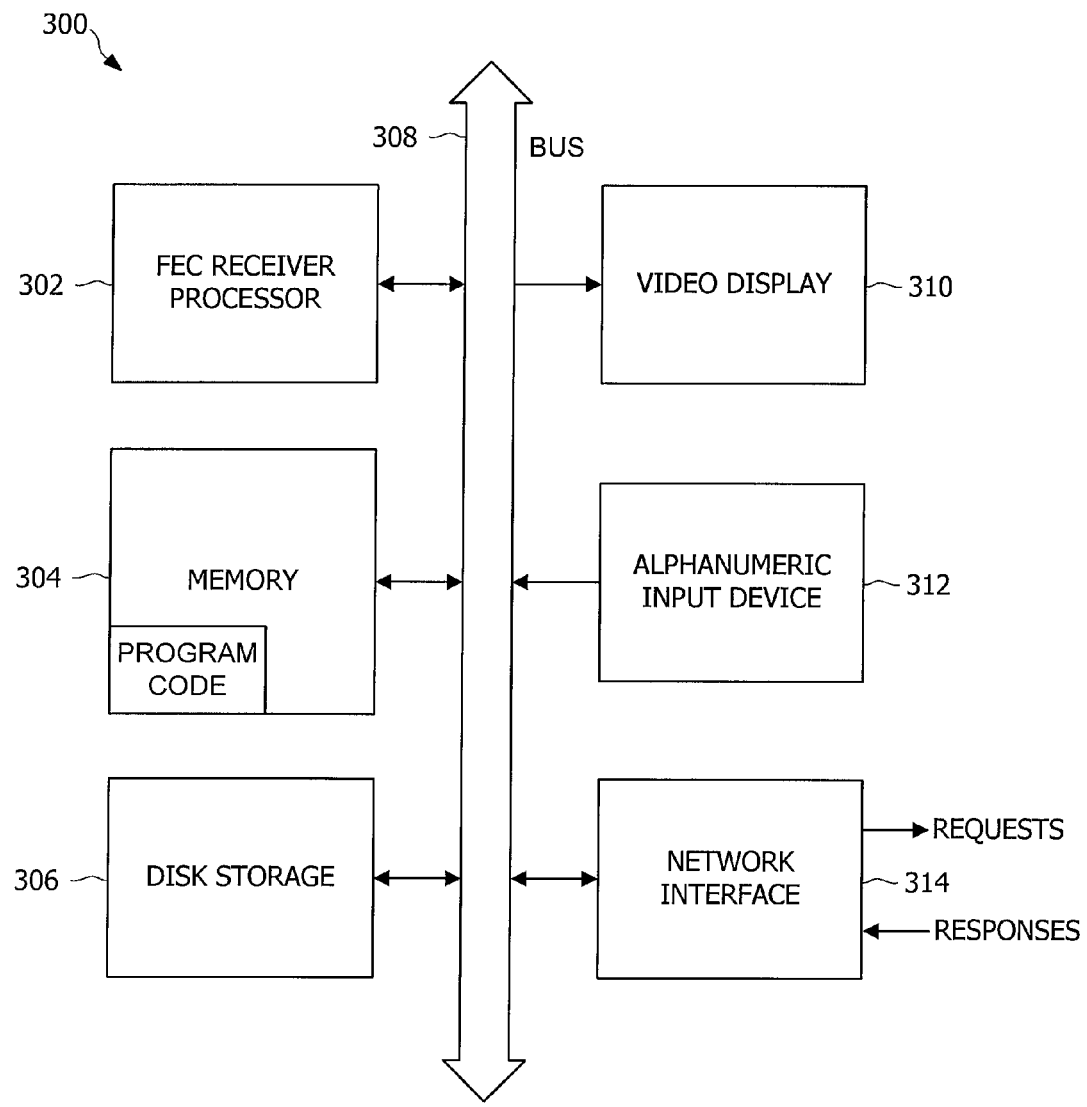
FIG. 3 is an illustrative embodiment of an FEC receiver.

FIG. 3 is an illustrative embodiment of an FEC receiver 300. FEC receiver 300 is a system, such as broadcast system 104 and/or receiver system 106, that receives FEC encoded data. FEC receiver 300 may be implemented as a combination of hardware and software components, according to various embodiments. The receiver system may comprise a set of instructions that can be executed to cause the system to perform any one or more of the methodologies discussed herein. The system may be realized as a specific machine in the form of a computer. The system may be a server computer, a personal computer (PC), a mobile device, or any other system capable of executing a set of instructions (sequential or otherwise) that specify actions to be taken by that system. Further, while only a single system is illustrated, the term "system" shall also be taken to include any collection of systems that individually or jointly execute a set (or multiple sets) of instructions to perform any one or more of the methodologies discussed herein.

FEC receiver system may include FEC receiver processor 302 (e.g., a central processing unit (CPU)), a memory 304 which may store program code during execution, and disk storage 306, all of which communicate with each other via a bus 308. The system may further include a video display unit 310 (e.g., a liquid crystal display (LCD) or cathode ray tube (CRT)). The system also may include an alphanumeric input device 312 (e.g., a keyboard), and a network interface device 314 for sending requests for encoded media and receiving encoded media in response to the requests.

The disk storage 306 may include a machine-readable medium on which may be stored one or more sets of instructions (e.g., software) embodying any one or more of the methodologies or functions described herein. The instructions may also reside, completely or at least partially, within the memory 304 and/or within the FEC receiver processor 302 during execution thereof by the system, with the memory 304 and the FEC receiver processor 302 also constituting machine-readable media.

Figure 4:
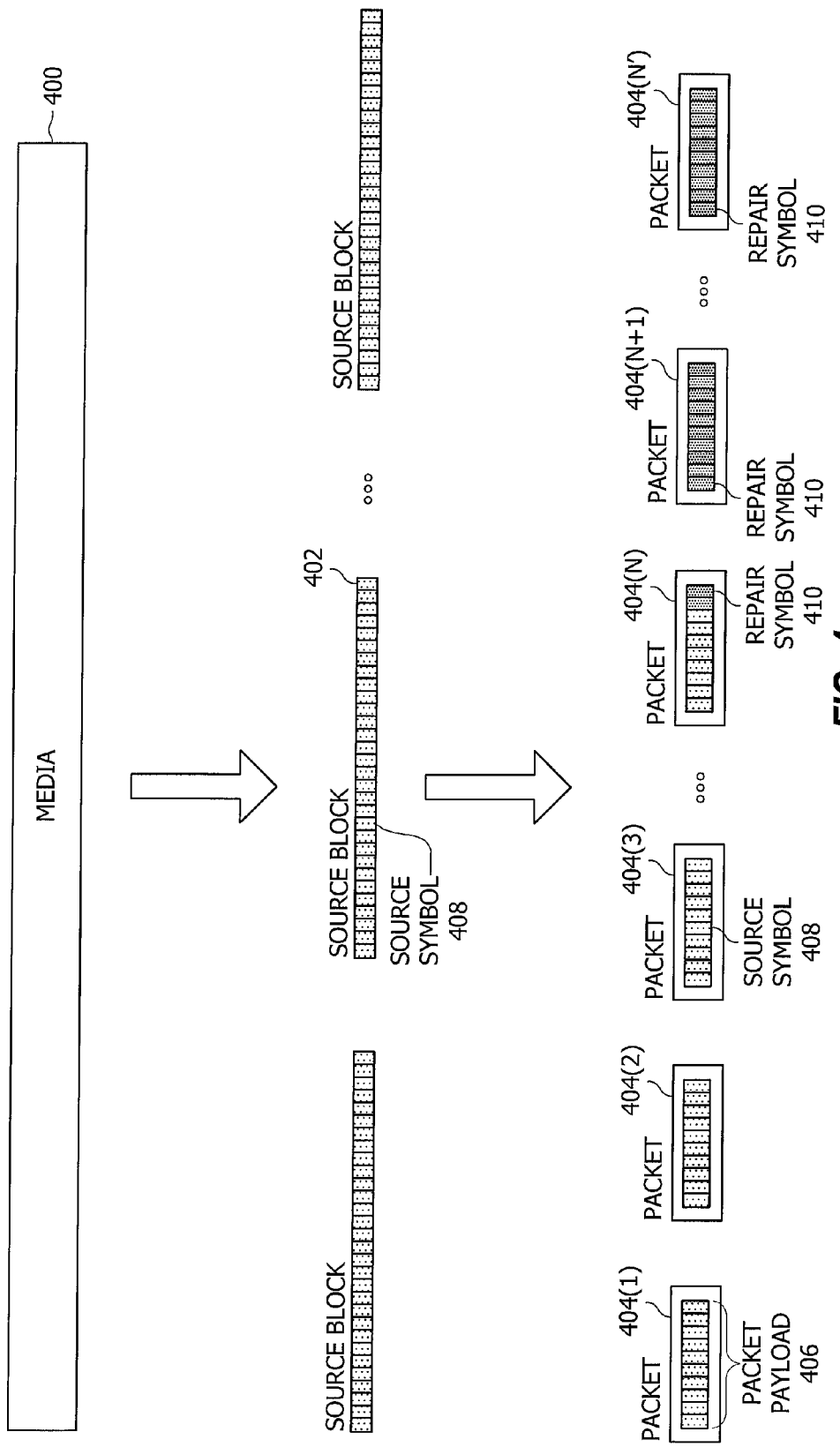
FIG. 4 illustrates packetization of encoded media data for transmission from an FEC sender to an FEC receiver, according to an embodiment.

FIG. 4 illustrates packetization of encoded media data for transmission from FEC sender 200 to FEC receiver 300, according to an embodiment. Media 400 may be a file, stream, or other data to be transmitted over a packet network. The data of media 400 may be video, audio, a presentation, images, or the like.

Media 400 may be divided into source blocks 402 by FEC sender 200. Each source block 402 can be independently FEC encoded by FEC sender 200. An input symbol generator of FEC sender 200 can divide source block 402 into K source symbols 408. FEC encoding may generate encoded data including encoded symbols. The encoded symbols may include source symbols 408 and repair symbols 410.

Encoded symbols including source symbols 408 and repair symbols 410 may be transmitted by FEC sender 200 to FEC receiver 300 as packets 404(1), 404(2), 404(3) . . . 404(N), 404(N+1) . . . 404(N'), where packets 404(1), . . . , 404(N−1) each contain G source symbols, packet 404(N) contains a combination of G source and repair symbols, and packets 404(N+1) . . . 404(N') each contain G repair symbols. N may be a fixed or adjustable value stored or received by FEC sender 200. N may be a target number of packets, that, when received by a receiver, allows recovery of the source block by the receiver according to a predetermined level of probability, e.g., with high fidelity. "High fidelity" in this context can mean high probability, certainty, or almost certainty. For example, when N packets are received, decode failure probability of source block 402 may be on the order of 0.01, 0.0001, 0.000001, or another probability (e.g., a probability that can be determined based on a reception overhead in accordance with the RaptorQ code). In some embodiments, the target size of the source block in octets is provided instead of N. The encoded data of source block 402 may be transmitted in multiple packets or in a single packet.

Source symbols 408 and repair symbols 410 may be sent in the payload 406 of a single packet 404, as shown at 404(N). Typically, the first N−1 packets will contain source symbols 408, packet 404(N) will contain both source symbols 408 and repair symbols 410, and the remaining N'-N packets will contain repair symbols 410. Alternatively, source symbols 408 and repair symbols 410 may be sent in the payloads of separate packets. The total number of packets generated for a source block will typically be a value N'>N, wherein a receiver can recover the source block from reception of any N out of the N' packets. The value of N' can be a predetermined value, e.g., predetermined based on one or more factors such as expected network conditions and packet loss. Alternatively, N' may be determined dynamically as packets are transmitted by the sender, for example, based on feedback from one or more receivers or from network elements.

Figure 5:
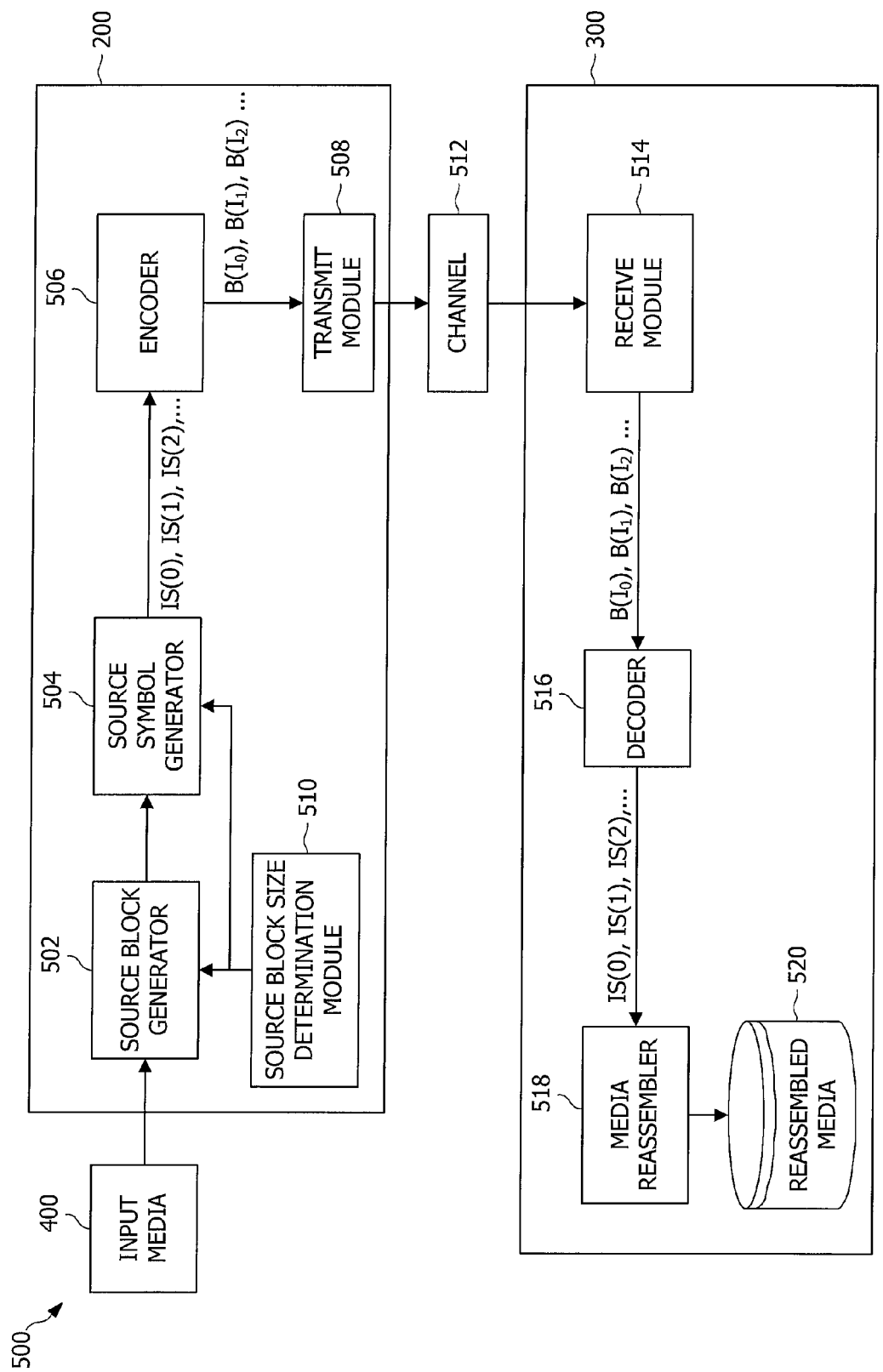
FIG. 5 is an illustrative block diagram of a communication system, according to an embodiment.

FIG. 5 is an illustrative block diagram of a communication system 500, according to an embodiment. Media 400 may be received by FEC sender 200 via network interface 214. Source block generator 502, source symbol generator 504, encoder 506, transmit module 508, and source block size determination module 510 may be modules stored as sets of instructions on disk storage unit 206 for execution by sender processor 202 of FEC sender 200. It should be appreciated that source block generator 502, source symbol generator 504, encoder 506, and/or transmit module 508 may comprise modules of a sender system operating as intermediate sender functionality with respect to a source of media 400 to provide transmission of the media in accordance with the concepts herein. Additionally or alternatively, source block generator 502, source symbol generator 504, encoder 506, and/or transmit module 508 may comprise modules of a source system operating as a source with respect to media 400 and which provides transmission of the media in accordance with the concepts herein.

Source block generator 502 may receive media 400 and divide media 400 into source blocks 402. The size of source blocks 402 may be determined by source block size determination module 510 and provided to source block generator 502. Source symbol generator 504 may divide source block 402 into a sequence of one or more source symbols 408 (also referred to as "input symbols"). In the sequence of source symbols (IS(0), IS(1), IS(2), . . . ) each source symbol may have a value and a position (denoted in FIG. 5 as a parenthesized integer). As explained above, the possible values for source symbols, i.e., its alphabet, is typically an alphabet of $2^M$ symbols, so that each source symbol codes for M bits of the input file. The value of M is generally determined by the use of communication system 500, but a general purpose system might include a symbol size input for source symbol generator 504 so that M can be varied from use to use. For example, the size of source symbols 408 may be determined by source block size determination module 510 of embodiments and provided to source symbol generator 504. The output of source symbol generator 504 is provided to encoder 506.

Encoder 506 generates encoded symbols ($B(I_0)$, $B(I_1)$, $B(I_2)$, . . . ) from the source symbols 408 provided by the source symbol generator. In some embodiments, the value of each encoded symbol may be generated based on a key, on some function of one or more of the source symbols, and possibly one or more redundant symbols that had been computed from the source symbols. The collection of source symbols and redundant symbols that give rise to a specific encoded symbol is referred to herein as the encoded symbol's "associated symbols" or just its "associates". Typically, but not always, M is the same for input symbols and encoded symbols, i.e., they both code for the same number of bits.

Encoder 506 may provide encoded symbols ($B(I_0)$, $B(I_1)$, $B(I_2)$, . . . ) to a transmit module 508. Transmit module 508 may also be provided with the key of each such encoded symbol. Transmit module 508 transmits the encoded symbols, and depending on the keying method used, transmit module 508 might also transmit some data about the keys of the transmitted encoded symbols, over a channel 512 to a receive module 514 of FEC receiver 300. Channel 512 is assumed to be an erasure channel, but that is not a requirement for proper operation of communication system 500.

As explained above, channel 512 can be a real-time channel, such as a path through the Internet or a broadcast link from a television transmitter to a television recipient or a telephone connection from one point to another, or channel 512 can be a storage channel, such as a CD-ROM, disk drive, Web site, or the like. Channel 512 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 512 is assumed to be an erasure channel, communications system 500 does not assume a one-to-one correspondence between the encoded symbols that exit receive module 514 and the encoded symbols that go into transmit module 508. In fact, where channel 512 comprises a packet network, communications system 500 might not even be able to assume that the relative order of any two or more packets is preserved in transit through channel 512. Therefore, the key of the encoded symbols may be determined using one or more keying schemes, and not necessarily determined by the order in which the encoded symbols exit receive module 514.

Receive module 514 provides the encoded symbols to a decoder 516. Decoder 516 may use keys provided by a dynamic key regenerator and/or a static key generator together with the corresponding encoded symbols, to recover the input symbols (again IS(0), IS(1), IS(2), . . . ). Decoder 516 may provide the recovered input symbols to a media reassembler 518, which may generate a copy 520 of media 400. Media copy 520 may be stored at disk storage 306, memory 304, or FEC receiver processor 302 of FEC receiver 300. In some embodiments, media copy 520 may be displayed by video display unit 310 or otherwise played back by FEC receiver 300.

Modules 502, 504, 506, 508, 510, 514, 516 and 518 can be any suitable hardware components, software components, physical media, or any combination thereof, so long as transmit module 508 is adapted to transmit encoded symbols and any needed data about their keys to channel 512 and receive module 514 is adapted to receive symbols and potentially some data about their keys from channel 512. Other elements shown in FIG. 5 (and elsewhere herein, whether described as a module, a step, a process, etc.,) can also be implemented using hardware, software, and/or program code stored on electronically-readable media.

In some embodiments, to determine a source block size, source block size determination module 510 may operate to select a source block size such that the source symbols for the source block fit within the payload of an integer number of packets with at least a predetermined amount of packet payload capacity remaining. In particular, embodiments operate to select a source block size to provide for the combination of the source symbols for the source block and a number of repair symbols corresponding to the reception overhead for the particular erasure code used to fit within the payload of an integer number of packets. Accordingly, embodiments may utilize information regarding a packet payload size, target decode reliability, receive overhead, source block size constraints, and/or a source block size reference to determine a source block size, and possibly an associated source symbol size, to be used with respect to data to be transmitted via a packet network.

Figure 6:
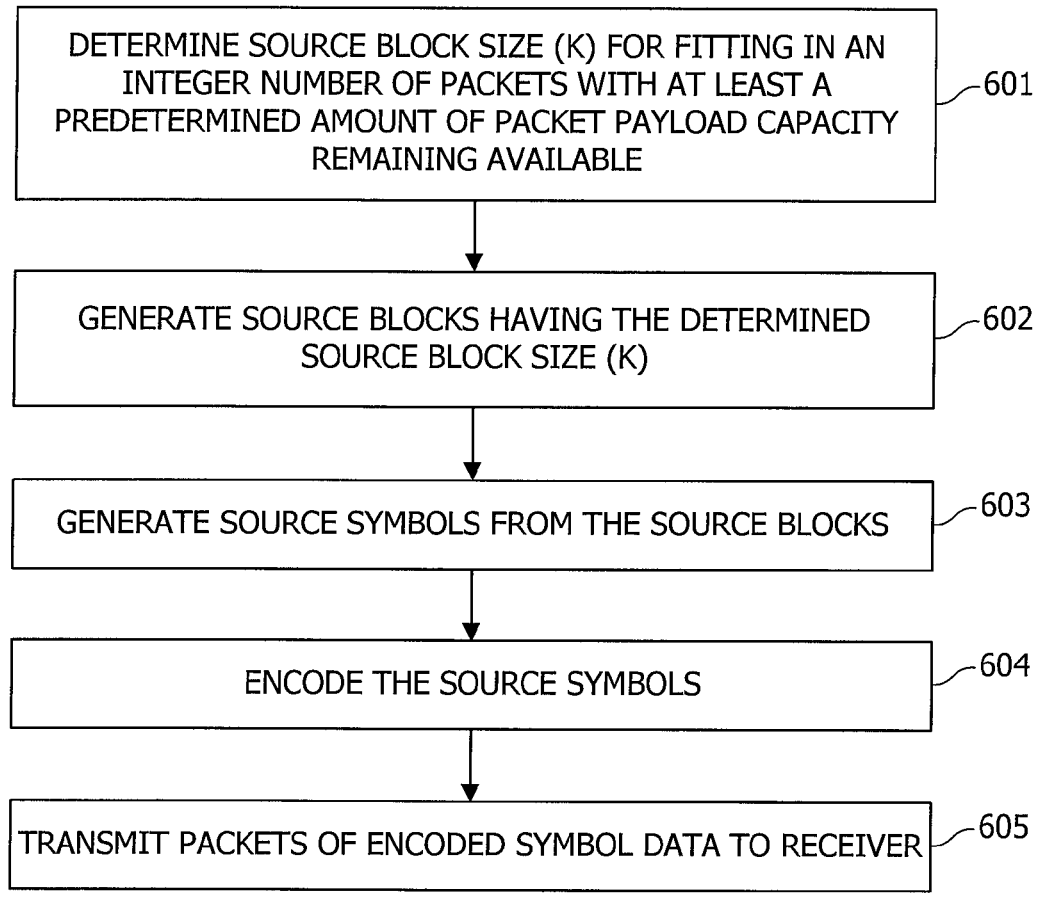
FIGS. 6-9 are illustrative flow diagrams for determining a source block size, according to embodiments herein.

FIG. 6 is an illustrative flow diagram for determining a source block size, according to embodiments herein. At operation 601, a determination is made regarding a source block size for fitting the data of a source block within the payload of an integer number of packet network transmission packets with at least a predetermined amount of packet payload capacity remaining available. For example, logic of source block size determination module 510 may operate to utilize information regarding packet payload size (P) and/or target packet payload size (P') to determine a source block size (e.g., in bytes, octets, symbols, etc.) in accordance with embodiments herein. Additionally or alternatively, logic of source block size determination module 510 may utilize information regarding a target number of packets to recover the source block reliably (N), target upper bound on data reception overhead (R), symbol size (T), number of symbols per packet (G), lower bound on the number of source symbols (K'), and/or other data transmission parameters herein to determine a source block size according to embodiments herein. In operation according to embodiments, the source block size may be determined as a number of source symbols (K).

The determination of source block size may be constrained by one or more attributes or parameters. For example, the source block size determined may be constrained to be approximately (e.g., within an upper and/or lower bound limit) of a target source block size (S). Such a target source block size may, for example, be provided to facilitate determining a source block size compatible with or otherwise suitable for use with low latency streaming media delivery applications.

The predetermined amount of packet payload capacity remaining available in the aforementioned integer number of packets beyond the determined source block size comprises at least a size of a symbol reception overhead for an encoding technique (e.g., erasure encoding, such as FEC) used with respect to the transmission of the source block data. In operation according to embodiments, a desired symbol reception overhead (O) may be selected and provided to source block size determination module 510 for use in determining a source block size. Such symbol reception overhead information may additionally or alternatively be provided as a target or range, such as in the form of a target upper bound on symbol reception overhead (R). The symbol reception overhead, and/or a target value therefor, may be selected, for example, based upon a desired or target reliability available using a selected encoding technique with respect to the communication channel conditions. For example, the source block size is selected so as to result in the packet payload capacity of an integer number of packets to be filled (or as nearly filled as is practicable) with the source block data and associated symbol recovery overhead data according to embodiments.

Using information regarding packet payload size, symbol reception overhead, and/or source block size constraint, embodiments may operate to determine a total size (e.g., in bytes, octets, symbols, etc.) of a transmission block (i.e., an overall size of the source block and associated reception overhead for high fidelity recovery of the source block data) which provides for a low (e.g., minimized or optimized) reception overhead. A transmission block size determined according to embodiments is selected to facilitate efficiently including both the data of the source block as well as the redundant data for high fidelity recovery of the source block data within a target number of packets (N) to recover the source block reliably. Thus, although a total number of packets transmitted (N') with respect to the source block data may be greater than the aforementioned target number of packets (i.e., N≤N'), only any combination of the target number of packets (N) need be received for reliable recovery of the source block data. In contrast, should the source block size be selected such that the data of the symbol reception overhead may not be carried in the payload of a packet or packets carrying the source block data, at least an additional packet (i.e., a packet which does not carry source block data, but which does carry redundant data of the symbol reception overhead) would need to be received for reliable recovery of the source block data. Where the number of such additional packets is a significant fraction of the number of packets carrying the source block data, the reception overhead is increased (e.g., not minimized or optimized). For example, if 10 is the number of packets carrying the source block data and 2 is the number of additional packets carrying repair or redundant data, then the reception overhead is 20%, which is a significant reception overhead.

It should be appreciated determination of source block size at operation 601 may include determinations of attendant and/or associated data transmission parameters. For example, embodiments of source block size determination module 510 operate to determine symbol size (T), number of symbols per packet (G), packet payload size (P), etc. In one example, the symbol size (T) is determined using information regarding a target source block size (S) and information regarding a desired or target reliability available using a selected encoding technique (e.g., a number of redundant encoded symbols needed to be received for reliable recovery of the source block).

The source block size and/or other data transmission parameters determined at operation 601 of embodiments may be provided to various functional blocks of a communication system providing transmission of the source block data. For example, such data transmission parameters may be provided to source block generator 502, source symbol generator 504, encoder 506, and/or transmit module 508 of communication system 500 (FIG. 5) for use in transmission of media 400. In one example, a source block size is provided by source block size determination module 510 to source block generator 502 for controlling the size of the source blocks generated thereby. Similarly, a symbol size and/or number of symbols per packet is provided by source block size determination module 510 to source symbol generator 504 according to an example herein.

Having determined the source block size and provided that information to source block generator 502, at operation 602, source block generator 502 may divide media 400 into source blocks 402 such that at least one source block 402 may have a size determined at operation 601. For example, source block 402 may have K symbols. An illustrative approach to determining a symbol size T is discussed further below.

At operation 603, source symbol generator 504 may generate source symbols 408 from source block 402. At operation 604, encoder 506 may encode source symbols 408 to generate repair symbols 410. At operation 605, transmit module 508 may transmit encoded symbols over channel 512 to receive module 514 of FEC receiver 300. The encoded symbols may include K source symbols 408 and O repair symbols 410. The encoded symbols may be transmitted in the packet payloads 406 of packets 404.

To aid in the understanding of operation to provide source block determinations in accordance with operation 601 of embodiments, the following provides a specific example determination. It should be appreciated, however, that the concepts herein are not limited to the particulars of this example, but instead the example is give merely to provide a more perceptible representation of concepts presented above.

Assume that it is desirable to provide data transmission using source blocks that are approximately 10 kilobytes in size. For example, a streaming application may be determined to provide satisfactory latency and/or communication overhead using source blocks of 10 kilobytes. Accordingly, 10 kilobytes may be input as a target source block size (S). Where the packet payload size (P) is 1000 bytes there would be 10 packets of data for a source block having the target source block size (S=10 kilobytes). Assume further, however, that the erasure code (e.g., FEC) to be used with respect to transmission of the source data has some inherent overhead associated with its use. For example, it may be necessary to receive, on average, two additional encoded symbols beyond the original number of source symbols to insure a high reliability of decoding (i.e., the symbol reception overhead (O) is 2 in this example). Accordingly, in the foregoing example, receipt of 102 symbols would be needed to recover 100 source symbols of high reliability.

In situations where the source block size is relatively short, the two symbols of overhead in the foregoing example may result in a quite high overhead. For example, where the source block size is 10 kilobytes, the aforementioned two symbols of overhead may present a very large overhead (e.g., assuming the 1000 byte packet payload size of the foregoing example and a 1000 byte symbol size, 12 packets may be needed to recover 10 pieces of information of the same size, resulting in 20% overhead).

Operation of source block size determination module 510 to provide source block determinations of embodiments herein, however, chooses the source block size so that the size of the source block is somewhat smaller than the aggregate packet payload of an integer number of data packets (e.g., slightly smaller than the combined packet payload provided by a target number of packets to recover the source block reliably (N)). Continuing with the above example, where a target source block size (S) is 10 kilobytes, operation according to embodiments chooses a symbol size and the source block size so that the data of the source block fits into the 10,000 bytes (10 kilobytes) of 10 packets (each packet providing a packet payload of 1000 bytes) such that the reception overhead is minimized.

It should be appreciated that although a target number of packets to recover the source block reliably (N) may be 10 in the foregoing example, the total number of packets transmitted (N') with respect to any particular source block may be larger (i.e., N≤N'). For example, depending upon the channel conditions, the transmission reliability desired, the amount of acceptable communication overhead, etc., packets including encoded symbols in addition to those of those of the source block and the symbols needed for reliably recovery (e.g., the 102 symbols in the above example) may be transmitted (e.g., where N is 10, N' may be 12 to provide for robust data transmission in a channel resulting in lost data, wherein the 2 additional packets include repair symbols such that the source data may be recovered from any 10 packets of the 12 packets transmitted).

Where, for example, the target reception overhead is 1% (i.e., it is desired to only receive 1% more than the size of the original data in order to reliably recover the data), operation 601 determines a source block size, with the appropriate symbol size, which is slightly smaller than the 10,000 byte aggregate packet payload so that, when the data of the source block is placed into this 10,000 byte limit, a sufficient amount of repair data may also be placed into the 10,000 byte aggregate payload to minimize reception overhead. For example, the source block size may be selected to facilitate placing an amount of repair data within the 10,000 byte aggregate packet payload (the payload of the 10 packets in this example) such that the original source data can be recovered from any 10 packets received. Logic implemented for determining the source block size according to embodiments may thus choose a symbol size so that two symbols (the number encoded symbols beyond the original number of source symbols needed to insure a high reliability of decoding in this example) are at most 1% (the target reception overhead in this example) of the number of symbols in the source block, thereby suggesting that there be at least 200 symbols in the source block. From the foregoing, the logic for determining the source block size may determine that approximately 20 symbols are to be included each packet of the 10 packets of this example.

Having identified a target total number of symbols for the packet payload, the logic for determining the source block size may thus determine a target symbol size. For example, dividing the aggregate packet payload size by the total number of symbols provides a symbol size, which in the above example provides 10,000/200=50 bytes. Using the information that two additional symbols are to be used as the reception overhead, logic of the source block size determination module may thus determine that a source block is to comprise 198 source symbols (i.e., the number of source symbols (K) is 198) in this example. That is, the source block size may be determined to be 198 symbols, each 50 bytes in length. Stated another way, the source block size may be determined to be 9,900 bytes.

The foregoing source block size allows the data of the source block to be carried in the aggregate payload of 10 packets, in the above example, with sufficient payload capacity remaining to also carry 2 symbols of repair data. Such an embodiment provides a configuration in which reception of the 10 packets provides for reliable decoding of the source data while meeting the desired reception overhead of 1% in this example, and provides a symbol size and the source block size so that the data of the source block fits into the 10,000 bytes (10 kilobytes) of 10 packets (each packet providing a packet payload of 1000 bytes) with minimal reception overhead. Where additional packets of encoded data (e.g., each additional repair packet may carry 20 repair symbols of 50 bytes each) are transmitted in association with the source data (e.g., 12 total packets transmitted, as in the above example), reception of any 10 such packets allows for reliable decoding of the source data.

From the above it can be seen that operation to provide selection of source block size may be initiated through use of various initial data transmission parameters, such as different combinations of target source block size (S), target packet payload size (P'), packet payload size (P), target number of packets to recover source block reliably (N), symbol size (T), number of symbols per packet (G), number of source symbols (K), lower bound on the number of source symbols (K'), alignment factor (Al), symbol reception overhead (O), and target upper bound on data reception overhead (R). Using one or more such initial data transmission parameters, a source block size may be determined according to embodiments herein. Moreover, various other data transmission parameters utilized with respect to the transmission of the source data, such as packet payload size (P), symbol size (T), number of symbols per packet (G), number of source symbols (K), and symbol reception overhead (O), may be determined depending upon the initial data transmission parameters present.

It should be appreciated that application of the foregoing techniques to provide source block size determination are not limited to a particular point with respect to the transmission of the source data, such as at initialization of the transmission. The forgoing concepts may be applied at various different points before and/or during data transmission, if desired. For example, source block size, symbol size, symbol reception overhead, and/or other data transmission parameters herein may be dynamically, such as during data transmission based upon channel conditions, transmitter operation, receiver operation, etc.

As another example for implementing the foregoing, source block size determination module 510 may use an approach that is constrained such that:

1. The source symbols for source block 402 can be sent within N packets 404.

2. With reception of any N of the N' sent packets 404, source block 402 can be recovered at a receiver with sufficient reliability. For example, sufficient reliability may require that at least K+O symbols will be received within the N received packets, where K is the number of source symbols 408 in source block 402 and O is the symbol reception overhead that guarantees recovery with sufficient reliability, or high fidelity, for the FEC code being used. In some embodiments, the value of O that guarantees recovery may be independent of the value of K In other embodiments, the value of O that guarantees recovery may depend on K and may also depend on other factors, such as the value of N' and/or the amount of packet loss. In some embodiments, N may be a number of packets 404 needed to recover a source block according to a predetermined probability.

3. The size P of the packet payload 406 for symbol data (source symbols 408 and/or repair symbols 410) is close to the upper bound target payload size P'.

4. Optionally, the symbol size is a multiple of alignment factor Al.

5. The size of source block is at least N*P'*(1−R), where R is a specified target upper bound on data reception overhead to recover the source block 402, i.e., the data reception overhead to recover the source block is at most an R fraction of the data needed to recover the source block.

Figure 7:
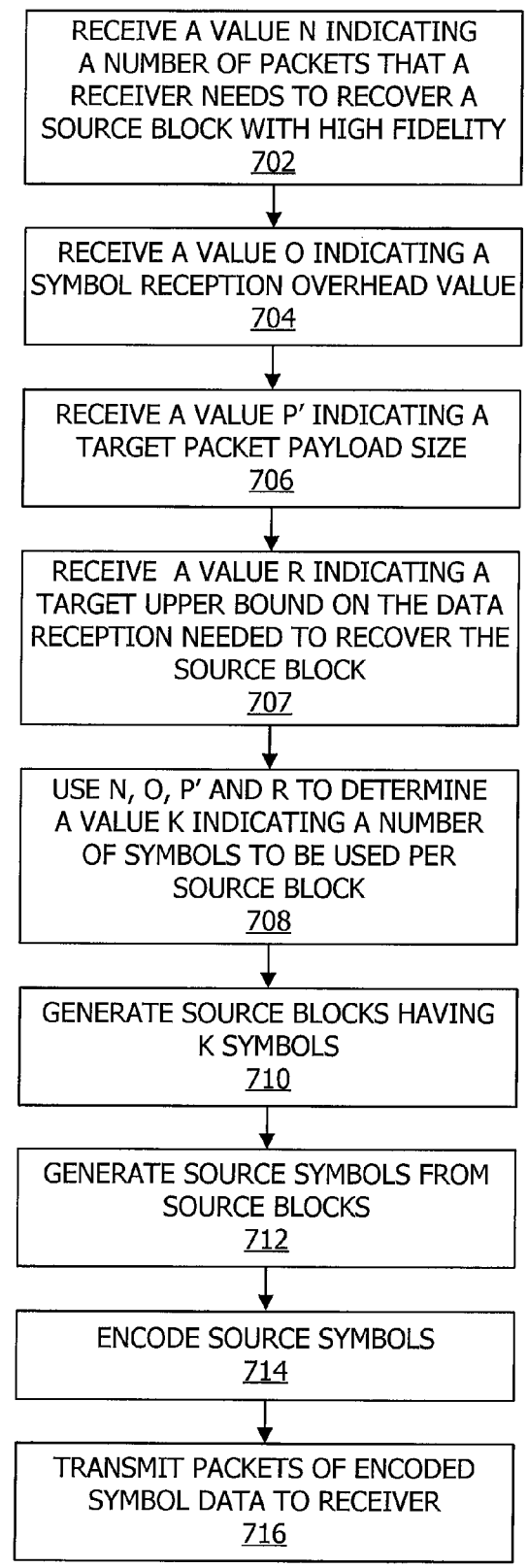

FIG. 7 is an illustrative flow diagram for determining a source block size, according to embodiments herein. At operation 702, a value N, indicating a number of packets 404 that a receiver needs to recover source block 402 with high fidelity, may be received by source block size determination module 510. In some embodiments, N may be a number of packets 404 needed to recover a source block according to a predetermined probability. At operation 704, a value O, indicating a symbol reception overhead, may be received by source block size determination module 510. At operation 706, a value P', indicating a target packet payload size for packet payload 406, may be received by source block size determination module 510. The value of P' may depend on the type of network over which packets are transmitted and/or the application.

At operation 707, a value R is specified that provides a target upper bound on the data reception needed to recover the source block. In some embodiments, N, O, P' and/or R may be stored in either of memory 304 or disk storage 306. In other embodiments, N, O, P' and/or R may be received by FEC sender 200 via either of network interface 214 or alphanumeric input device 212.

At operation 708, a source block size is determined using at least N, O, P' and R. In some embodiments, the source block size is a value K indicating a number of symbols 408, 410 to be used per source block 402. A value T, indicating a symbol size, e.g., in units of octets or bits, may also be determined. An illustrative approach to determining K and T is discussed below. However, it will be recognized that other approaches to determining K and T may be used. For example, in lieu of receiving N and P', as indicated at operations 702 and 706, a target source block size in bits or octets can be received and used in the determination of K and T.

At operation 710, source block generator 502 may divide media 400 into source blocks 402. At least one source block 402 may have a size determined at operation 708. For example, source block 402 may have K symbols. An illustrative approach to determining a symbol size T is discussed further below.

At operation 712, source symbol generator 504 may generate source symbols 408 from source block 402. At operation 714, encoder 506 may encode source symbols 408 to generate repair symbols 410. At operation 716, transmit module 508 may transmit encoded symbols over channel 512 to receive module 514 of FEC receiver 300. The encoded symbols may include K source symbols 408 and O repair symbols 410. The encoded symbols may be transmitted in the packet payloads 406 of packets 404.

Figure 8:
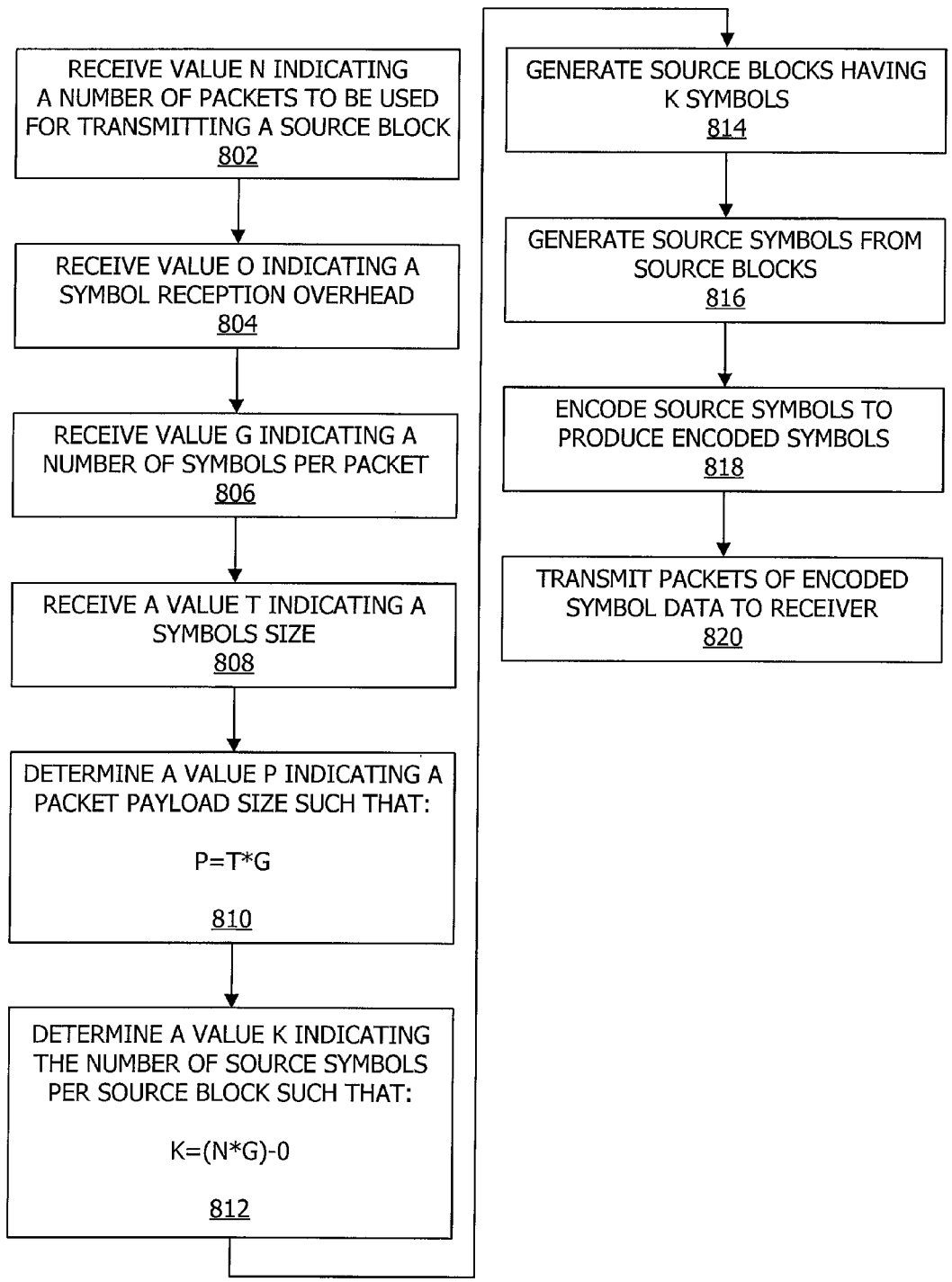

FIG. 8 is an illustrative flow diagram for determining a source block size, according to embodiments herein. At operation 802, a value N, indicating a number of packets 404 to be used for transmitting a source block 402, may be received by source block size determination module 510. At operation 804, a value O, indicating a symbol reception overhead, may be received by source block size determination module 510. The value of O may be determined independent of K and other factors, or may depend on K and other factors, depending on properties of the FEC code to be used. In general, the relative overhead O/K for an FEC code is a decreasing function of increasing K. For example, for the RaptorQ code described in IETF RFC 6330, the value of O=2 guarantees recovery of the source block with high fidelity, e.g., with probability 99.9999%, independent of K, and thus O/K for the RaptorQ code is a decreasing function of increasing K.

At operation 806, a value G may be received by source block size determination module 510. Alternatively, G may be determined by source block size determination module 510, e.g., as explained below with reference to operation 814. G may indicate a number of symbols (408 and/or 410) per packet 404.

At operation 808, a value T may be received by source block size determination module 510. Alternatively, T may be determined by source block size determination module 510, e.g., as explained below with reference to operation 816. T may indicate a size (e.g., in bytes or octets) for source symbols 408 and/or repair symbols 410.

In some embodiments, one or more of N, O, G, P', T and/or R may be stored in any of memory 304 or disk storage 306. In other embodiments, N O, G, P', T and/or R may be received by FEC sender 200 via either of network interface 214 or alphanumeric input device 212.

At operation 810, a value P indicating size of packet payload 406 may be determined. For example, P may be determined using T and G. In one embodiment, P is determined as follows:

$$P=T*G$$

At operation 812, a value K indicating a number of symbols (408 and/or 410) per source block 402 is determined. For example, K may be determined using N, G, and O. In one embodiment, K is determined as follows:

$$K=(N*G)-O$$

In an illustrative example, input received by source block size determination module 510 may indicate that N=10 and O=2, as indicated at operations 802-804. Input received by source block size determination module 510 may additionally indicate that G=10 and T=128, as indicated at operations 806-808, or G and T may be calculated, as described further below. At operation 810, the size P of packet payload 406 is determined to be 1280 bytes. At operation 812, the size K indicating a number of symbols 408 per source block 402 is determined to be 98. Data reception overhead R can be determined as R=O/K. The resulting reception overhead R is 0.0205. In this example, the reception of any 10 packets 404 allows recovery of source block 402 with sufficient reliability.

At operation 814, source block generator 502 may divide media 400 into source blocks 402. At least one source block 402 may have a size as determined at operation 812. For example, source block 402 may have K symbols (e.g., 98 symbols), each symbol of size T=128 bytes.

At operation 816, source symbol generator 504 may generate source symbols 408 from source block 402. At operation 818, encoder 506 may encode source symbols 408 to produce encoded symbols. At operation 820, transmit module 508 may transmit encoded symbols over channel 512 to receive module 514 of FEC receiver 300, wherein each such transmitted packet in the example above carries G=10 encoded symbols, each of size T=128 bytes. The encoded symbols may include source symbols 408 and repair symbols 410. The encoded symbols may be transmitted in the packet payloads 406 of packets 404.

Figure 9:
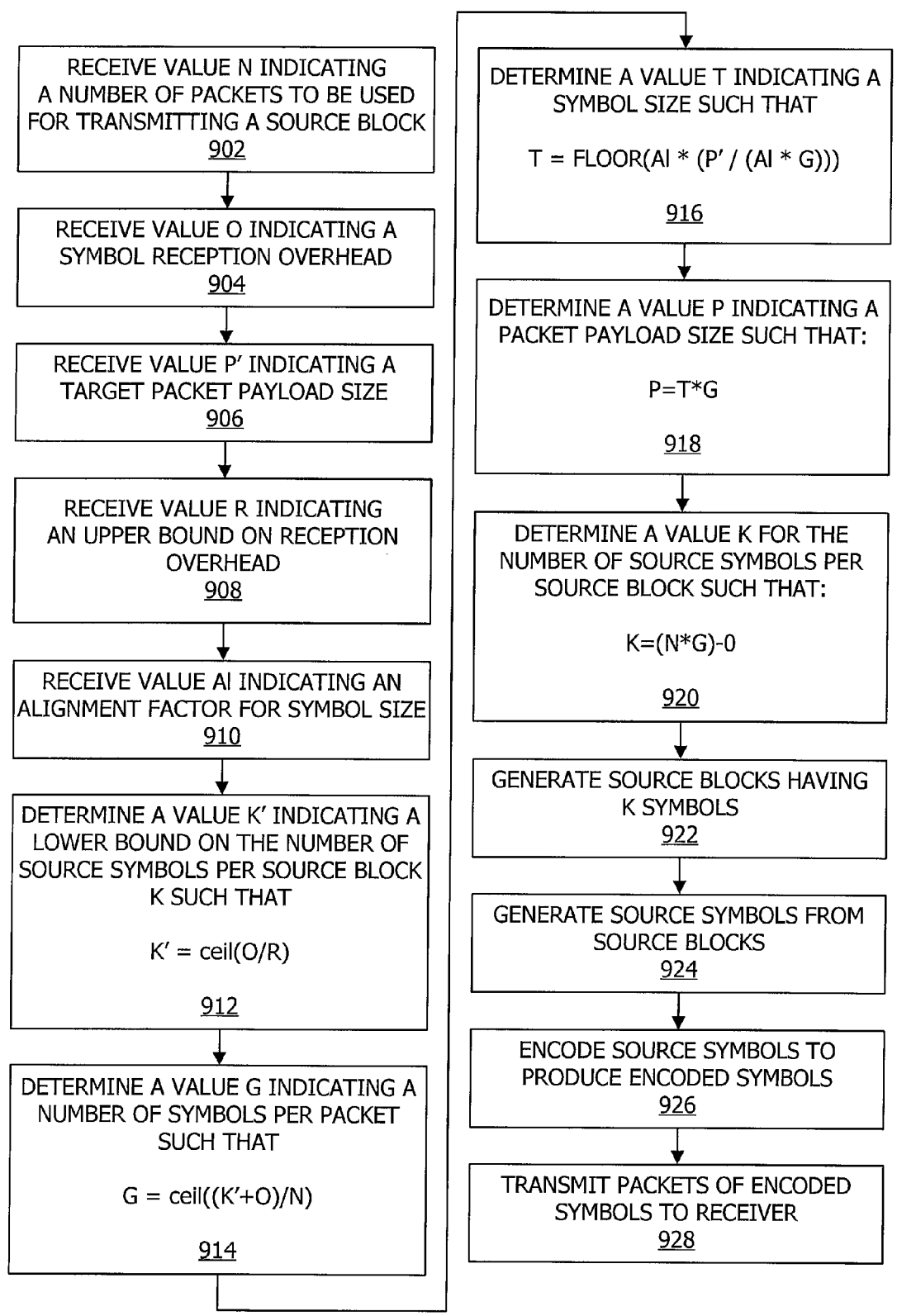

FIG. 9 is an illustrative flow diagram for determining a source block size, according to embodiments herein. At operation 902, a value N, indicating a number of packets 401 to be used for transmitting a source block 402, may be received by source block size determination module 510. At operation 904, a value O, indicating a symbol reception overhead, may be received by source block size determination module 510. At operation 906, a value P', indicating a target packet payload size for packet payload 406, may be received by source block size determination module 510.

At operation 908, a value R may be received by source block size determination module 510. R is a value indicating a target upper bound on data reception overhead, i.e., a target upper bound the ratio of O (symbol reception overhead) to K (the number of source symbols per source block). In some embodiments, in the output of encoder 506, R is such that O/K≤R.

At operation 910, a value Al may be received by source block size determination module 510. Al may indicate an alignment factor in bytes for the size of symbols 408, 410. For example, using an alignment factor of eight results in symbols having a size that is a multiple of eight. Using an alignment factor may increase the efficiency of encoding by FEC sender 200 and decoding by FEC receiver 300. An alignment factor of one may be used where no alignment is necessary.

In some embodiments, N, O, P', R and/or Al may be stored in any of memory 304 or disk storage 306. In other embodiments, N, O, P', R, and/or Al may be received by FEC sender 200 via either of network interface 214 or alphanumeric input device 212. In other embodiments, some or all of N, P', O and R may be derived from the application requirements and/or the network over which packets are to be transmitted.

At operation 912, a value K' indicating a lower bound on the number of source symbols 408 per source block 402 may be determined. For example, K' may be determined using O and R. In one embodiment, K' is determined as K'=ceil(O/R), where ceil(x) is the smallest integer that is at least x.

At operation 914, a value G indicating a number of symbols (408 and/or 410) per packet 404 is determined. For example, G may be determined using K', O, and N. In one embodiment, K' is determined as G=ceil((K'+O)/N).

At operation 916, a value T, indicating a size (e.g, in bytes) of symbols 408 and/or 410, is determined. For example, T may be determined using Al, P', and G. In one embodiment, K' is determined as T=floor(Al*(P'/(Al*G))), where floor(x) is the largest integer that is at most x.

At operation 918, a value P indicating a size of packet payload 406 may be determined. For example, P may be determined using T and G. In one embodiment, P is determined as P=T*G.

At operation 920, a value K indicating a number of symbols (408 and/or 410) per source block 402 is determined. For example, K may be determined using N, G, and O. In one embodiment, K is determined as K=(N*G)−O.

At operation 922, source block generator 502 may divide media 400 into source blocks 402. At least one source block 402 may have a size as determined at operation 920. For example, source block 402 may have K symbols.

At operation 924, source symbol generator 504 may generate source symbols 408 from source block 402. At operation 926, encoder 506 may encode source symbols 408 to produce encoded symbols. At operation 928, transmit module 508 may transmit encoded symbols over channel 512 to receive module 514 of FEC receiver 300. The encoded symbols may include source symbols 408 and repair symbols 410. The encoded symbols may be transmitted in the packet payloads 406 of packets 404, wherein each such packet may carry G symbols in its payload.

In an illustrative example, input received by source block size determination module 510 at operations 902-910 may indicate that N=10, O=2, P'=1280, R=0.022, and Al=8. At operation 912, the value K', indicating a lower bound on the number of source symbols per source block, is determined to be 91. At operation 914, the value G, indicating a number of symbols per packet, is determined to be 10. At operation 916, a value T, indicating a symbol size, is determined to be 128. At operation 918, a value P, indicating a size of packet payload, is determined to be 1280. At operation 920, a value K, indicating a number of symbols per source block, is determined to be 98. The source block size is K*T=12,544 bytes. In this example, the Nth packet contains the last eight source symbols of the source block and two repair symbols, and every packet carries 10 symbols. FIG. 4 shows illustrative source block 402, packets 404, packet payloads 406, source symbols 408, and repair symbols 410.

In a second illustrative example, input received by source block size determination module 510 at operations 902-910 may indicate that N=50, O=2, P'=1280, R=0.022, and Al=8. In this example, T=640, G=2, P=1280, K=98, and the source block size is 62,720 bytes. In this example, there is no packet that carries both source and repair symbols.

In a third illustrative example, input received by source block size determination module 510 at operations 902-910 may indicate that N=40, O=2, P'=1280, R=0.01, and Al=8. In this example, T=208, G=6, P=1248, K=238, and the source block size is 49,504 bytes. In this example, packets 1 through 39 each carry 6 source symbols, packet 40 carries 4 source symbols and 2 repair symbols, and packets 41 onwards each carry 6 repair symbols.

For some FEC codes, the value of O may vary for different values of K, for different values of total transmitted symbols N' and/or for varying network conditions. When this is the case, the value of O may be approximated. Alternatively, the value of O may be determined using an iterative algorithm. In one embodiment, the value of O is determined using an iterative algorithm that proceeds as follows: a value of O is presumed, and based on the presumed value of O, a value of K may be calculated. The actual value of O can be calculated based on this value of K and based on the value of N' to be used with K If the actual value of O is at most the presumed value of O, then the algorithm can terminate. If the actual value of O is greater than the presumed value of O, the iterative algorithm can be repeated, using as the presumed value of O the actual value of O calculated in this iteration of the algorithm.

From the foregoing, it can be appreciated that in operation according to embodiments of the present disclosure logic of a data transmission system, such as FEC sender 200, may operate to choose a size of the source block rather than a source of the data being transmitted, such as an application or server providing the data for transmission. Moreover, the selected source block size may be based upon one or more constraints, such as a desired reception overhead, target source block size, upper/lower bounds on source block size, target symbol size, target packet payload size, etc.

Considerations Regarding the Description

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The blocks of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software executed by a processor, firmware, or any combination thereof. If implemented in software executed by a processor, the functions may be stored on or transmitted over as one or more instructions or code on a computer-readable medium. Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of computer-readable media.

The previous description is provided to enable any person skilled in the art to make and/or use the apparatus, systems, and methods described. Various modifications to the disclosure will be readily apparent to those skilled in the art, and the generic principles defined herein may be applied to other variations without departing from the spirit or scope of the disclosure. Thus, the disclosure is not to be limited to the examples and designs described herein but is to be accorded the widest scope consistent with the principles and novel features disclosed herein.

What is claimed is:

1. A method for data communication over a communications channel, the method comprising:
   receiving one or more data transmission parameters with respect the data communication over the communications channel; and
   determining, using at least one data transmission parameter of the one or more data transmission parameters, a source block size for the data communication over the communications channel, wherein the source block size is a size determined to fit in an integer number of packets used for the data communication with at least a particular amount of packet payload capacity remaining available in the integer number of packets, and wherein the particular amount of packet payload capacity remaining available corresponds to a target symbol reception overhead when the integer number of packets are received by a receiver.

2. The method of claim 1, wherein the source block size is determined to facilitate recovery of data of a source block to a predetermined probability when the integer number of packets used for the data communication are received by the receiver.

3. The method of claim 1, further comprising:
   determining, using the at least one data transmission parameter, a symbol size for the data communication over the communications channel, wherein the symbol size is a size determined to result in a number of repair symbols, corresponding to source symbols from a source block having the determined source block size, fitting within the particular amount of packet payload capacity remaining while meeting the target symbol reception overhead when the integer number of packets are received by the receiver.

4. The method of claim 3, wherein the at least one data transmission parameter comprises a value indicating the target symbol reception overhead.

5. The method of claim 1, further comprising:
   determining, using the at least one data transmission parameter, a number of symbols per packet for the integer number of packets used for the data communication.

6. The method of claim 1, wherein the at least one data transmission parameter comprises a data transmission parameter selected from the group consisting of a value indicating a number of packets needed to recover a source block according to a predetermined probability, a value indicating a target packet payload size, and a value indicating a target data reception overhead for recover of a source block.

7. The method of claim 6, wherein the at least one data transmission parameter comprises the value indicating a number of packets needed to recover a source block according to a predetermined probability, and wherein the integer number of packets is the number of packets needed to recover a source block according to a predetermined probability.

8. The method of claim 1, wherein the determining the source block size is performed by a data transmission system which is not a source of media communicated by the data communication.

9. The method of claim 8, further comprising:
   receiving, by the data transmission system, media to be delivered to the receiver;
   generating, by the data transmission system, source blocks from the media, wherein at least one source block is the determined source block size;
   generating, by the data transmission system, encoded symbols from source symbols of the at least one source block;
   packetizing, by the data transmission system, the encoded symbols into at least the integer number of packets; and
   transmitting, by the data transmission system, the at least the integer number of packets to the receiver.

10. An apparatus for data communication over a communications channel, the apparatus comprising:
    one or more data processors; and
    one or more non-transitory computer-readable storage media containing program code configured to cause the one or more data processors to perform operations including:
    receiving one or more data transmission parameters with respect the data communication over the communications channel; and
    determining, using at least one data transmission parameter of the one or more data transmission parameters, a source block size for the data communication over the communications channel, wherein the source block size is a size determined to fit in an integer number of packets used for the data communication with at least a particular amount of packet payload capacity remaining available in the integer number of packets, and wherein the particular amount of packet payload capacity remaining available corresponds to a target symbol reception overhead when the integer number of packets are received by a receiver.

11. The apparatus of claim 10, wherein the source block size is determined to facilitate recovery of data of a source block to a predetermined probability when the integer number of packets used for the data communication are received by the receiver.

12. The apparatus of claim 10, wherein the operations further include:
    determining, using the at least one data transmission parameter, a symbol size for the data communication over the communications channel, wherein the symbol size is a size determined to result in a number of repair symbols, corresponding to source symbols from a source block having the determined source block size, fitting within the particular amount of packet payload capacity remaining while meeting the target symbol reception overhead when the integer number of packets are received by the receiver.

13. The apparatus of claim 12, wherein the at least one data transmission parameter comprises a value indicating the target symbol reception overhead.

14. The apparatus of claim 10, wherein the operations further include:
    determining, using the at least one data transmission parameter, a number of symbols per packet for the integer number of packets used for the data communication.

15. The apparatus of claim 10, wherein the at least one data transmission parameter comprises a data transmission parameter selected from the group consisting of a value indicating a number of packets needed to recover a source block according to a predetermined probability, a value indicating a target packet payload size, and a value indicating a target data reception overhead for recover of a source block.

16. The apparatus of claim 15, wherein the at least one data transmission parameter comprises the value indicating a number of packets needed to recover a source block according to a predetermined probability, and wherein the integer number of packets is the number of packets needed to recover a source block according to a predetermined probability.

17. The apparatus of claim 10, wherein the determining the source block size is performed by a data transmission system which is not a source of media communicated by the data communication.

18. The apparatus of claim 17, wherein the operations further include:
- receiving, by the data transmission system, media to be delivered to the receiver;
- generating, by the data transmission system, source blocks from the media, wherein at least one source block is the determined source block size;
- generating, by the data transmission system, encoded symbols from source symbols of the at least one source block;
- packetizing, by the data transmission system, the encoded symbols into at least the integer number of packets; and
- transmitting, by the data transmission system, the at least the integer number of packets to the receiver.

* * * * *